United States Patent
Hwang et al.

(10) Patent No.: US 10,706,771 B2
(45) Date of Patent: Jul. 7, 2020

(54) DISPLAY PANEL OF AN ORGANIC LIGHT EMITTING DIODE DISPLAY DEVICE HAVING A PENTILE PIXEL STRUCTURE

(71) Applicant: Samsung Display Co., Ltd, Yongin-si (KR)

(72) Inventors: Young-In Hwang, Suwon-si (KR); Elly Gil, Seoul (KR); Eungtaek Kim, Hwaseong-si (KR); Jina Lee, Seongnam-si (KR); Joohyeon Jo, Asan-si (KR); Seongbaik Chu, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/290,970

(22) Filed: Mar. 4, 2019

(65) Prior Publication Data

US 2019/0279563 A1    Sep. 12, 2019

(30) Foreign Application Priority Data

Mar. 6, 2018 (KR) .................. 10-2018-0026529

(51) Int. Cl.
*G09G 3/3225* (2016.01)
*H01L 27/32* (2006.01)
(Continued)

(52) U.S. Cl.
CPC ......... *G09G 3/3225* (2013.01); *G09G 3/3266* (2013.01); *G09G 3/3275* (2013.01);
(Continued)

(58) Field of Classification Search
CPC ... G09G 2300/0452; G09G 2300/0426; G09G 3/3607; G09G 3/3208; G09G 2320/0242; G09G 2320/0233
See application file for complete search history.

(56) References Cited

U.S. PATENT DOCUMENTS

| 9,990,889 B2 | 6/2018 | Song et al. |
| 2013/0050236 A1* | 2/2013 | Hsu .......................... G09G 5/02 345/589 |

(Continued)

FOREIGN PATENT DOCUMENTS

| KR | 10-2005-0119367 | 12/2005 |
| KR | 10-2013-0081530 | 7/2013 |
| KR | 10-2016-0024316 | 3/2016 |

*Primary Examiner* — Dong Hui Liang
(74) *Attorney, Agent, or Firm* — H.C. Park & Associates, PLC

(57) ABSTRACT

A display panel of an OLED display device includes a first OLED disposed in a first sub-pixel region, a second OLED disposed in a second sub-pixel region adjacent to the first sub-pixel region in a row direction, a third OLED disposed in a third sub-pixel region adjacent to the first sub-pixel region in a column direction, a fourth OLED disposed in a fourth sub-pixel region adjacent to the second sub-pixel region in the column direction and adjacent to the third sub-pixel region in the row direction, a first sub-pixel circuit disposed in the first sub-pixel region and a fourth sub-pixel circuit disposed in the fourth sub-pixel region, both configured to drive the first OLED, a second sub-pixel circuit disposed in the second sub-pixel region, and configured to drive the fourth OLED, a third sub-pixel circuit disposed in the third sub-pixel region, and configured to drive the third OLED.

13 Claims, 11 Drawing Sheets

(51) Int. Cl.
*G09G 3/3266* (2016.01)
*G09G 3/3275* (2016.01)

(52) U.S. Cl.
CPC . *H01L 27/3218* (2013.01); *G09G 2300/0426* (2013.01); *G09G 2300/0452* (2013.01); *G09G 2310/08* (2013.01)

(56) References Cited

U.S. PATENT DOCUMENTS

2013/0175514 A1    7/2013  Han et al.
2019/0131324 A1*   5/2019  Jiang .................. H01L 27/1244

* cited by examiner

DISPLAY PANEL OF AN ORGANIC LIGHT EMITTING DIODE DISPLAY DEVICE HAVING A PENTILE PIXEL STRUCTURE

CROSS-REFERENCE TO RELATED APPLICATION

This application claims priority from and the benefit of Korean Patent Applications No. 10-2018-0026529, filed on Mar. 6, 2018, which is hereby incorporated by reference for all purposes as if fully set forth herein.

BACKGROUND

Field

Exemplary implementations of the invention relate generally to display devices and, more particularly, to display panels of organic light emitting diode (OLED) display devices having pentile pixel structures.

Discussion of the Background

To display a full color image, each pixel of an organic light emitting diode (OLED) display device may include sub-pixels emitting light of different colors, for example, red, green and blue sub-pixels. In a conventional OLED display device, the red, green and blue sub-pixels may be arranged in a linear form such that sub-pixels of the same color are arranged in each column.

Recently, to increase a resolution of a display screen, an OLED display device having a pentile pixel structure where a blue sub-pixel and/or a red sub-pixel are shared by two adjacent pixels has been developed. As used herein "pentile" refers to pixel structure in an OLED display device in which each pixel has two sub-pixels including one green sub-pixel and one red or blue sub-pixel, such as the RGBG matrix sub-pixel design marketed by the assignee of this application under its PenTile® trademark. Accordingly, in a pentile pixel structure, the pixel size may be reduced, and thus resolution of the OLED display device may be increased.

However, in a conventional OLED display device having the pentile pixel structure, all of the red, green and blue sub-pixels are disposed in the same row, and thus the red, green and blue sub-pixels are driven under the same driving condition (e.g., the same scan on time, the same emission time, etc.).

The above information disclosed in this Background section is only for understanding of the background of the inventive concepts, and, therefore, it may contain information that does not constitute prior art.

SUMMARY

Applicant discovered that driving the pixels in an OLED having a pentile pixel structure in the conventional line by line manner can cause defects in the display during operation including the appearance of a mura and/or an afterimage.

In a display panel of an organic light emitting diode (OLED) display device having a pentile pixel structure constructed according to the principles and exemplary implementations of the invention, an OLED of a first color (e.g., a green color) can be driven under a driving condition (e.g., a scan on time, an emission time, different off period ratios, etc.) different from a driving condition for an OLED of another color, thereby reducing occurrence of display defects such as muras and afterimages.

For example, as described herein, OLEDs in a display device may be alternately arranged in a pentile structure such that each pixel region includes an OLED of a first color (e.g., a green color) and one of an OLED of a second color (e.g., a red color) or an OLED of a third color (e.g., a blue color). Further, in one column (e.g., an even-numbered column) per two columns, an OLED in an odd-numbered row may be driven by a sub-pixel circuit in an even-numbered row, and an OLED in the even-numbered row may be driven by a sub-pixel circuit in the odd-numbered row. Accordingly, the OLED of the first color (e.g., the green color) can be driven under a driving condition (e.g., a scan on time, an AMOLED off ratio (AOR), etc.) that is different from the driving condition for the OLEDs of the second and third colors, and thus a mura and/or an afterimage may be reduced.

According to another advantageous feature that may be implemented in some embodiments of the invention, the first threshold voltage compensation time for the driving transistor included in the sub-pixel circuit driving two OLED's of one color (such as green) may be longer than the second threshold voltage compensation time for the driving transistor included in the sub-pixel circuit driving the other color OLED (such as red or green). Thus the sub-pixel circuit(s) driving the one color OLED (such as green) that is vulnerable to a mura may perform a threshold voltage compensation operation for a sufficient threshold voltage compensation time to reduce or prevent mura in the display. According to yet another advantageous feature that may be implemented in some embodiments of the invention, the sub-pixel circuits receiving a first emission control signal may provide the two OLEDs light of the first color (e.g., green) with a driving current that is increased compared to first off period ratio. Accordingly, the OLED display device according to some exemplary embodiments may allow the driving transistors of the sub-pixel circuits to generate increased or higher driving current, thereby reducing an afterimage caused by a hysteresis of the driving transistors.

Additional features of the inventive concepts will be set forth in the description which follows, and in part will be apparent from the description, or may be learned by practice of the inventive concepts.

According to one or more exemplary embodiments, a display panel of an OLED display device, the display panel includes a first OLED disposed in a first sub-pixel region, and configured to emit light of a first color, a second OLED disposed in a second sub-pixel region adjacent to the first sub-pixel region in a row direction, and configured to emit light of a second color, a third OLED disposed in a third sub-pixel region adjacent to the first sub-pixel region in a column direction, and configured to emit light of a third color, a fourth OLED disposed in a fourth sub-pixel region adjacent to the second sub-pixel region in the column direction and adjacent to the third sub-pixel region in the row direction, and configured to emit light of the first color, a first sub-pixel circuit disposed in the first sub-pixel region, and configured to drive the first OLED in the first sub-pixel region, a second sub-pixel circuit disposed in the second sub-pixel region, and configured to drive the fourth OLED in the fourth sub-pixel region, a third sub-pixel circuit disposed in the third sub-pixel region, and configured to drive the third OLED in the third sub-pixel region, and a fourth sub-pixel circuit disposed in the fourth sub-pixel region, and configured to drive the second OLED in the second sub-pixel region.

The first and fourth OLEDs may be green OLEDs configured to emit green light, the second OLED may be a red OLED configured to emit red light, and the third OLED may be a blue OLED configured to emit blue light.

The second OLED in the second sub-pixel region may include an anode extension portion connected to the fourth sub-pixel circuit, and the fourth OLED in the fourth sub-pixel region may include another anode extension portion connected to the second sub-pixel circuit in the second sub-pixel region.

The first and second sub-pixel circuits may each receives a first scan signal having substantially the same value through a first scan line, and the third and fourth sub-pixel circuits may each receives a second scan signal having substantially the same value through a second scan line.

A first scan on time (SOT) of the first scan signal applied to the first and second sub-pixel circuits may be different from a second SOT of the second scan signal applied to the third and fourth sub-pixel circuits.

A first SOT of the first scan signal applied to the first and second sub-pixel circuits may be longer than a second SOT of the second scan signal applied to the third and fourth sub-pixel circuits.

The first and second sub-pixel circuits may further include first driving transistors, the third and fourth sub-pixel circuits may further include second driving transistors, a first threshold voltage compensation time for the first driving transistors included in the first and second sub-pixel circuits may be longer than a second threshold voltage compensation time for the second driving transistors included in the third and fourth sub-pixel circuits.

The first and second sub-pixel circuits may receive a first emission control signal having substantially the same value through a first emission control line, and the third and fourth sub-pixel circuits may receive a second emission control signal having substantially the same value through a second emission control line.

A first off period ratio of the first emission control signal applied to the first and second sub-pixel circuits may be different from a second off period ratio of the second emission control applied to the third and fourth sub-pixel circuits.

A first off period ratio of the first emission control signal applied to the first and second sub-pixel circuits may be greater than a second off period ratio of the second emission control applied to the third and fourth sub-pixel circuits.

The first and second sub-pixel circuits may drive the first and fourth OLEDs to emit the light of the first color with the first off period ratio that is increased from the second off period ratio for the second and third OLEDs.

The first and second sub-pixel circuits may provide the first and fourth OLEDs with a driving current corresponding to the increased first off period ratio, the driving current may be provided to the first and fourth OLEDs and might be greater than driving current provided to the second and third OLEDs.

According to one or more exemplary embodiments, a display panel of an OLED display device includes a first OLED disposed in a first sub-pixel region, and configured to emit light of a first color, a second OLED disposed in a second sub-pixel region adjacent to the first sub-pixel region in a row direction, and configured to emit light of a second color, a third OLED disposed in a third sub-pixel region adjacent to the first sub-pixel region in a column direction, and configured to emit light of a third color, a fourth OLED disposed in a fourth sub-pixel region adjacent to the second sub-pixel region in the column direction and adjacent to the third sub-pixel region in the row direction, and configured to emit light of the first color, a first sub-pixel circuit configured to drive the first OLED, a second sub-pixel circuit configured to drive the second OLED, a third sub-pixel circuit configured to drive the third OLED, a fourth sub-pixel circuit configured to drive the fourth OLED, a first scan line extending in the row direction through the first sub-pixel region and the second sub-pixel region, and connected to the first sub-pixel circuit, a second scan line extending in the row direction through the third sub-pixel region and the fourth sub-pixel region, and connected to the third sub-pixel circuit, a first auxiliary scan line connecting the first scan line to the fourth sub-pixel circuit, and a second auxiliary scan line connecting the second scan line to the third sub-pixel circuit.

The first sub-pixel may receive a first scan signal through the first scan line, the fourth sub-pixel circuit is configured to may be configured to receive the first scan signal through the first scan line and the first auxiliary scan line, the third sub-pixel circuit may be configured to receive a second scan signal through the second scan line, and the second sub-pixel circuit may be configured to receive the second scan signal through the second scan line and the second auxiliary scan line.

A first scan on time (SOT) of the first scan signal applied to the first and fourth sub-pixel circuits may be longer than a second SOT of the second scan signal applied to the second and third sub-pixel circuits.

The display panel may further include a first emission control line extending in the row direction through the first sub-pixel region and the second sub-pixel region, and connected to the first sub-pixel circuit, a second emission control line extending in the row direction through the third sub-pixel region and the fourth sub-pixel region, and connected to the third sub-pixel circuit, a first auxiliary emission control line connecting the first emission control line to the fourth sub-pixel circuit, and a second auxiliary emission control line connecting the second emission control line to the third sub-pixel circuit.

The first sub-pixel circuit may be configured to receive a first emission control signal through the first emission control line, the fourth sub-pixel circuit may be configured to receive the first emission control signal through the first emission control line and the first auxiliary emission control line, the third sub-pixel circuit may be configured to receive a second emission control signal through the second emission control line, and the second sub-pixel circuit may be configured to receive the second emission control signal through the second emission control line and the second auxiliary emission control line.

A first off period ratio of the first emission control signal applied to the first and fourth sub-pixel circuits may be greater than a second off period ratio of the second emission control applied to the second and third sub-pixel circuits.

The first and fourth sub-pixel circuits may be configured to drive the first and fourth OLEDs to emit the light of the first color with the first off period ratio that is increased compared to the second off period ratio for the second and third OLEDs.

According to one or more exemplary embodiments, an OLED display device includes a display panel, a data driver configured to provide data signals to the display panel, a scan driver configured to provide scan signals to the display panel, an emission driver configured to provide emission control signals to the display panel, and a timing controller configured to control the data driver, the scan driver and the emission driver. The display panel includes a first OLED disposed in a first sub-pixel region, and configured to emit light of a first color, a second OLED disposed in a second sub-pixel region adjacent to the first sub-pixel region in a row direction, and configured to emit light of a second color, a third OLED disposed in a third sub-pixel region adjacent to the first sub-pixel region in a column direction, and configured to emit light of a third color, a fourth OLED disposed in a fourth sub-pixel region adjacent to the second sub-pixel region in the column direction and adjacent to the third sub-pixel region in the row direction, and configured to emit light of the first color, a first sub-pixel circuit disposed in the first sub-pixel region, and configured to drive the first OLED in the first sub-pixel region, a second sub-pixel circuit disposed in the second sub-pixel region, and configured to drive the fourth OLED in the fourth sub-pixel region, a third sub-pixel circuit disposed in the third sub-pixel region, and configured to drive the third OLED in the third sub-pixel region, and a fourth sub-pixel circuit disposed in the fourth sub-pixel region, and configured to drive the second OLED in the second sub-pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
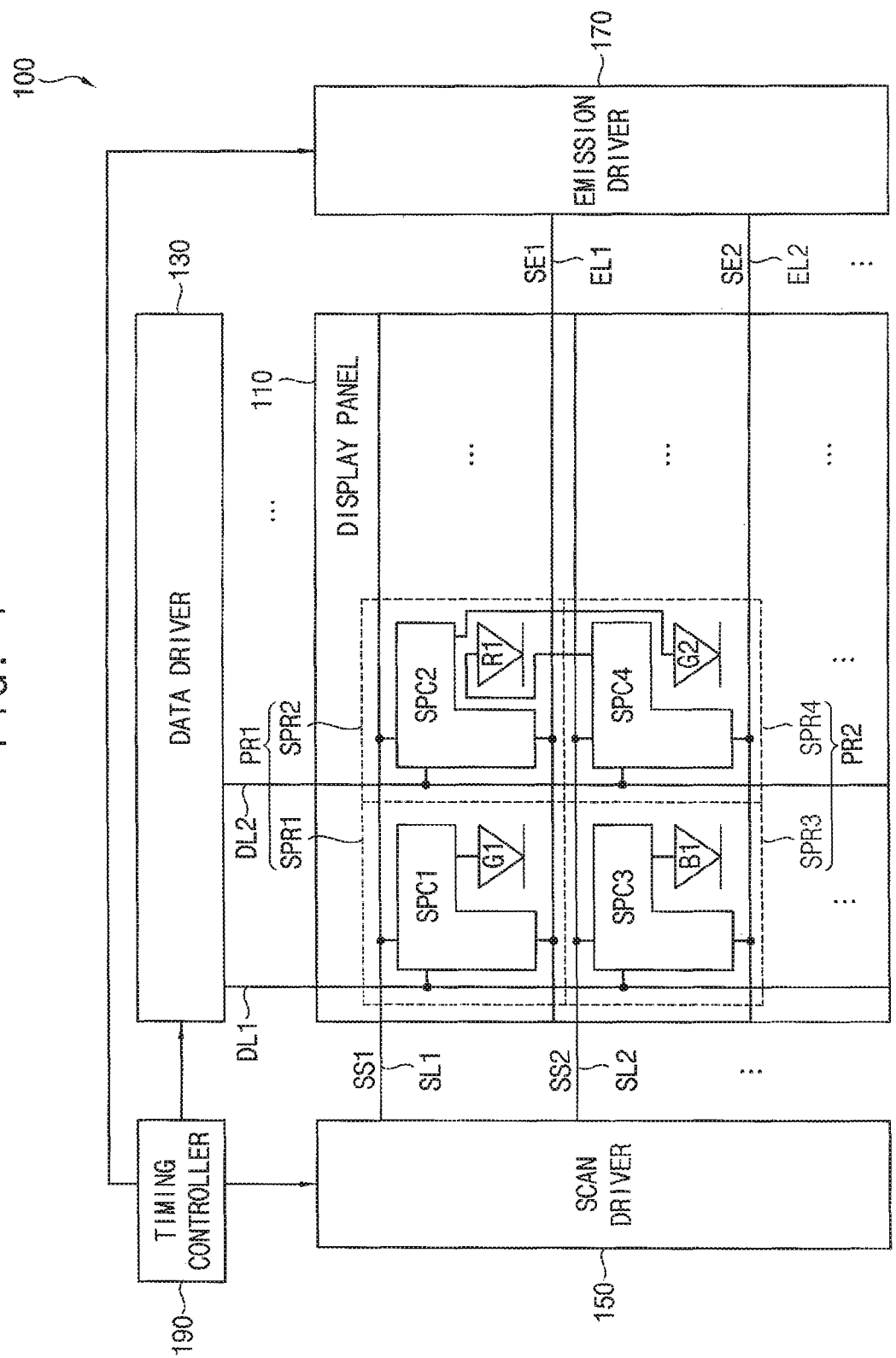
FIG. 1 is a block diagram illustrating an organic light emitting diode (OLED) display device constructed according to the principles and an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating an organic light emitting diode (OLED) display device constructed according to the principles and an exemplary embodiment of the invention.

Referring to FIG. 1, an organic light emitting diode (OLED) display device may include a display panel 110, a data driver 130 which provides data signals to the display panel 110, a scan driver 150 which provides scan signals SS1 and SS2 to the display panel 110, an emission driver 170 which provides emission control signals SE1 and SE2 to the display panel 110, and a timing controller 190 which controls the data driver 130, the scan driver 150 and the emission driver 170.

The display panel 110 may have a plurality of pixel regions PR1 and PR2, and each pixel region PR1 and PR2 may include two sub-pixel regions SPR1 and SPR2, and SPR3 and SPR4, respectively. Further, in each sub-pixel region SPR1, SPR2, SPR3 and SPR4, one OLED of G1, R1, B1 and G2 and one sub-pixel circuit of SPC1, SPC2, SPC3 and SPC4 may be disposed.

Figure 2:
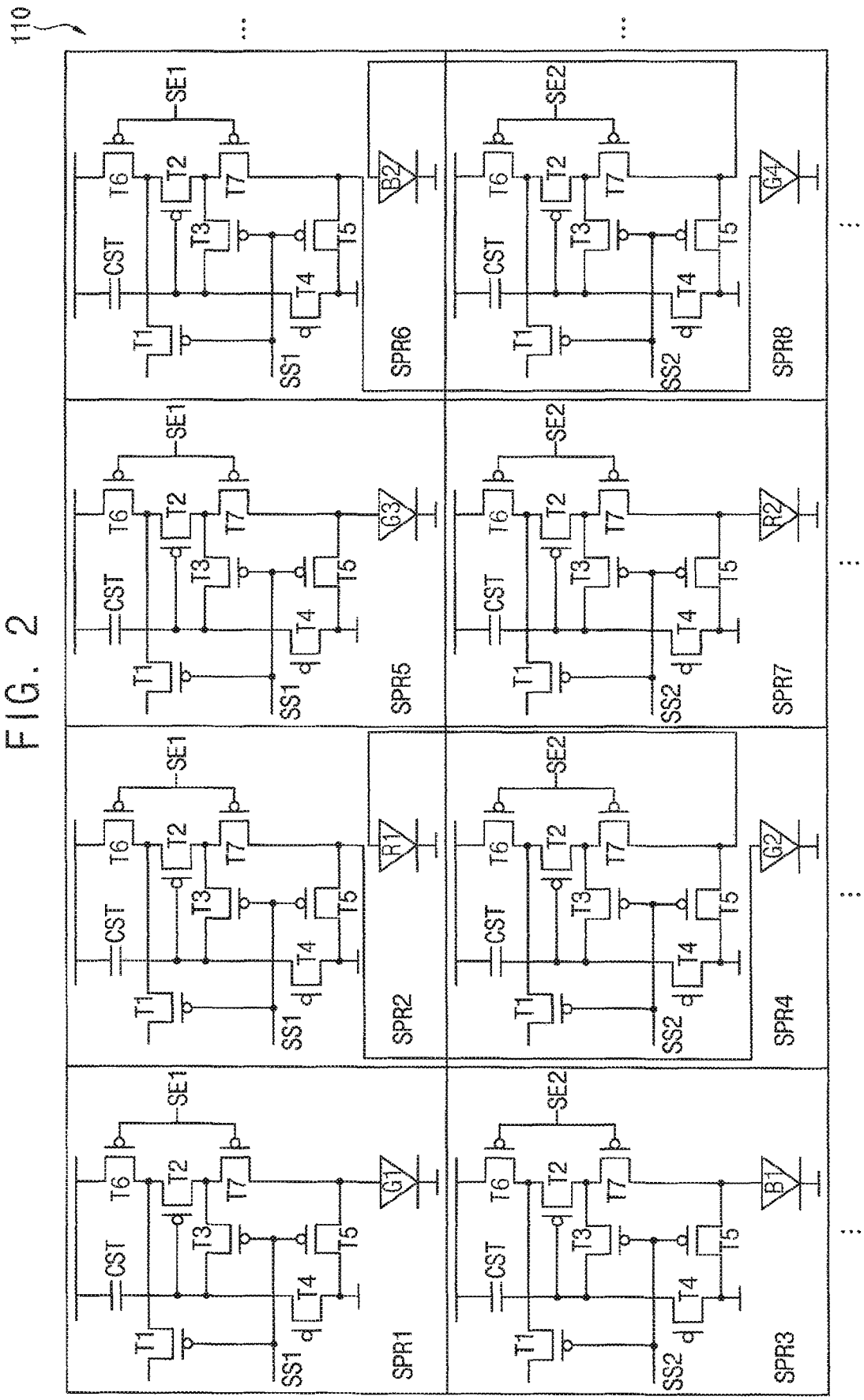
FIG. 2 is a circuit diagram illustrating the display panel of FIG. 1.
Figure 3:
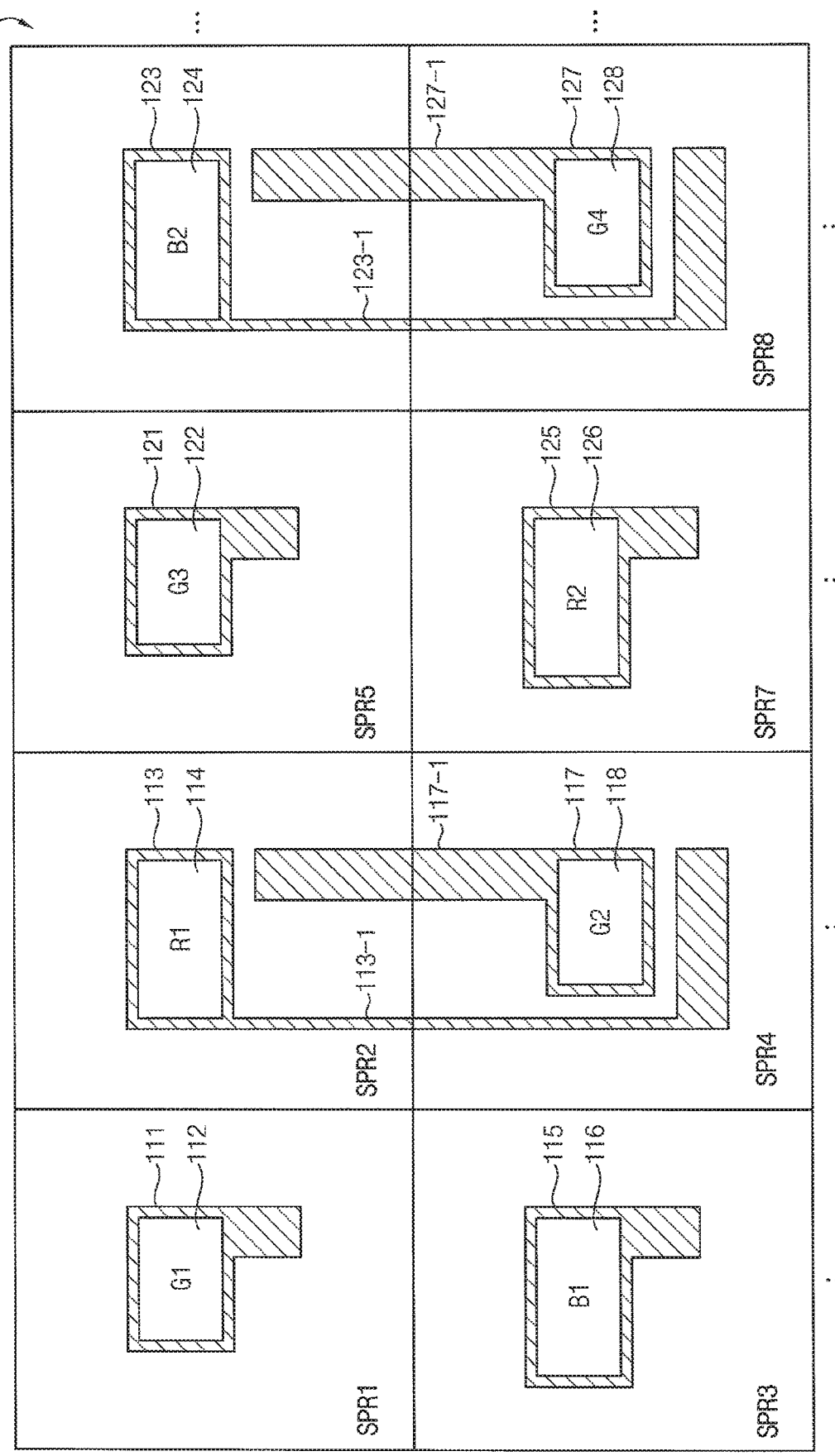
FIG. 3 is a diagram illustrating an exemplary layout of OLEDs included in the display panel of FIG. 1.

In the display panel 110, the OLEDs G1, R1, B1 and G2 may be arranged in a pentile structure such that, in each pixel region PR1 and PR2, one OLED G1 and G2 of a first color (e.g., a green color) is disposed, and one OLED R1 of a second color (e.g., a red color) or one OLED B1 of a third color (e.g., a blue color) is alternately disposed. For example, as illustrated in FIG. 1, a first OLED G1 emitting the green light and a second OLED R1 emitting the red light may be disposed in a first pixel region PR1, and a third OLED B1 emitting the blue light and a fourth OLED G2 emitting the green light may be disposed in a second pixel region PR2 adjacent to the first pixel region PR1 in a column direction (e.g., a direction of a data line DL1 and DL2). Thus, since two sub-pixels including one green OLED G1 and G2 and one red or blue OLED R1 and B1 are disposed in each pixel region PR1 and PR2, the display panel 110 may have a high resolution compared with a conventional display panel where each pixel includes three or more sub-pixels (e.g., red, green and blue sub-pixels). In some exemplary embodiments, as illustrated in FIGS. 1, 2, and 3, green, red, green and blue OLEDs may be sequentially and repeatedly arranged (i.e., in a GRGB arrangement) in odd-numbered rows, and blue, green, red and green OLEDs may be sequentially and repeatedly arranged (i.e., in a BGRG arrangement) in even-numbered rows. However, the arrangements of the OLEDs are not limited to the GRGB and BGRG arrangements.

Further, in the display panel 110, each sub-pixel circuit (e.g., SPC1) in a first column (e.g., an odd-numbered column) may drive the OLED (e.g., G1) in a sub-pixel region (e.g., SPR1) the same as a sub-pixel region (e.g., SPR1) in which the sub-pixel circuit (e.g., SPC1) is disposed, and each sub-pixel circuit (e.g., SPC2) in an even-numbered column (e.g., a second column) may drive the OLED (e.g., G2) in a sub-pixel region (e.g., SPR4) in a row different from a row in which the sub-pixel circuit (e.g., SPC2) is disposed. For example, as illustrated in FIG. 1, a first sub-pixel circuit SPC1 in a first sub-pixel region SPR1 may drive the first OLED G1 in the first sub-pixel region SPR1, a second sub-pixel circuit SPC2 in a second sub-pixel region SPR2 adjacent to the first sub-pixel region SPR1 in a row direction (e.g., a direction of a scan line SL1 and SL2 or a direction of an emission control line EL1 and EL2) may drive the fourth OLED G2 in a fourth sub-pixel region SPR4 adjacent to the second sub-pixel region SPR2 in the column direction, a third sub-pixel circuit SPC3 in a third sub-pixel region SPR3 adjacent to the first sub-pixel region SPR1 in the column direction may drive the third OLED B1 in the third sub-pixel region SPR3, and a fourth sub-pixel circuit SPC4 in the fourth sub-pixel region SPR4 adjacent to the third sub-pixel region SPR3 in the row direction may drive the second OLED R1 in the second sub-pixel region SPR2 adjacent to the fourth sub-pixel region SPR4 in the column direction.

Accordingly, the sub-pixel circuits SPC1 and SPC2 in a first row (e.g., an odd-numbered row), or the sub-pixel circuits SPC1 and SPC2 connected to a first scan line (e.g., an odd-numbered scan line) SL1 and/or a first emission control line (e.g., an odd-numbered emission control line) EL1 may drive only the OLEDs G1 and G2 emitting the light of the first color (e.g., the green color), and the sub-pixel circuits SPC3 and SPC4 in a second row (e.g., an even-numbered row), or the sub-pixel circuits SPC3 and SPC4 connected to a second scan line (e.g., an even-numbered scan line) SL2 and/or a second emission control line (e.g., an even-numbered emission control line) EL2 may drive only the OLEDs R1 and B1 emitting the light of the second color (e.g., the red color) or the third color (e.g., the blue color). Thus, since the sub-pixel circuits SPC1 and SPC2 driving the OLEDs G1 and G2 emitting the light of the first color (e.g., the green color) are connected to the scan and emission control lines SL1 and EL1 separate from the scan and emission control lines SL2 and EL2 to which the sub-pixel circuits SPC3 and SPC4 driving the OLEDs R1 and B1 emitting the light of the second color (e.g., the red color) or the third color (e.g., the blue color), the OLEDs G1 and G2 emitting the light of the first color may be driven under a driving condition (e.g., a scan on time, an off period ratio (which may be referred to as an AMOLED off ratio (AOR)), etc.) different from a driving condition for the OLEDs R1 and B1 emitting the light of the second color or the third color.

In some exemplary embodiments, the scan driver 150 may apply a first scan signal SS1 having a first scan on time (SOT) to the first scan line (e.g., the odd-numbered scan line) SL1 connected to the sub-pixel circuits SPC1 and SPC2 driving the OLEDs G1 and G2 emitting the light of the first color, and may apply a second scan signal SS2 having a second SOT different (in length) from the first SOT to the second scan line (e.g., the even-numbered scan line) SL2 connected to the sub-pixel circuits SPC3 and SPC4 driving the OLEDs R1 and B1 emitting the light of the second color or the third color. For example, the first SOT of the first scan signal SS1 applied to the sub-pixel circuits SPC1 and SPC2 driving the OLEDs G1 and G2 emitting the light of the first color may be longer than the second SOT of the second scan signal SS2 applied to the sub-pixel circuits SPC3 and SPC4 driving the OLEDs R1 and B1 emitting the light of the second color or the third color. In some exemplary embodiments, during the SOT, each sub-pixel circuit SPC1, SPC2, SPC3 and SPC4 may not only store the data signal, but also compensate a threshold voltage of a driving transistor, and thus the SOT of the scan signal SS1 and SS2 applied to each sub-pixel circuit SPC1, SPC2, SPC3 and SPC4 may be substantially the same as a threshold voltage compensation time for the driving transistor include in each sub-pixel circuit SPC1, SPC2, SPC3 and SPC4. Accordingly, a first threshold voltage compensation time for driving transistors included in the sub-pixel circuits SPC1 and SPC2 driving the OLEDs G1 and G2 emitting the light of the first color may be longer than a second threshold voltage compensation time for driving transistors included in the sub-pixel circuits SPC3 and SPC4 driving the OLEDs R1 and B1 emitting the light of the second color or the third color.

Generally, compared with the driving transistor of the sub-pixel circuit SPC3 and SPC4 driving the red or green OLED R1 and B1, the driving transistor of the sub-pixel circuit SPC1 and SPC2 driving the green OLED G1 and G2 may have a relatively high compensation point, and thus may require a relatively long threshold voltage compensation time. As described above, in the OLED display device 100 according to exemplary embodiments, the first threshold voltage compensation time for the driving transistor included in the sub-pixel circuit SPC1 and SPC2 driving the green OLED G1 and G2 may be longer than the second threshold voltage compensation time for the driving transistor included in the sub-pixel circuit SPC3 and SPC4 driving the red or blue OLED R1 and B1, and thus the sub-pixel circuit SPC1 and SPC2 driving the green OLED G1 and G2 that is vulnerable to a mura may perform a threshold voltage compensation operation for a sufficient threshold voltage compensation time. Accordingly, the mura of the OLED display device 100 may be reduced or prevented.

Further, in some exemplary embodiments, the emission driver 170 may apply a first emission control signal SE1 with a first off period ratio to the first emission control line (e.g., the odd-numbered emission control line) EL1 connected to the sub-pixel circuits SPC1 and SPC2 driving the OLEDs G1 and G2 emitting the light of the first color, and may apply a second emission control signal SE2 with a second off period ratio different from the first off period ratio to the second emission control line (e.g., the even-numbered emission control line) EL2 connected to the sub-pixel circuits SPC3 and SPC4 driving the OLEDs R1 and B1 emitting the light of the second color or the third color. For example, the first off period ratio of the first emission control signal SE1 applied to the sub-pixel circuits SPC1 and SPC2 driving the OLEDs G1 and G2 emitting the light of the first color may be greater than the second off period ratio of the second emission control signal SE2 applied to the sub-pixel circuits SPC3 and SPC4 driving the OLEDs R1 and B1 emitting the light of the second color or the third color. The sub-pixel circuits receiving the first emission control signal SE1 may drive the OLEDs G1 and G2 to emit the light of the first color with the first off period ratio that is increased compared to the second off period ratio for the OLEDs R1 and B1 emitting the light of the second color or the third color. Further, the sub-pixel circuits receiving the first emission control signal SE1 may provide the OLEDs G1 and G2 emitting the light of the first color with a driving current that is increased corresponding to the increased first off period ratio. Accordingly, the OLED display device 100 according to exemplary embodiments may allow the driving transistors of the sub-pixel circuits SPC1 and SPC2 to generate the increased driving current, or a higher driving circuit, thereby reducing an afterimage caused by a hysteresis of the driving transistors.

As described above, in the OLED display device 100 according to exemplary embodiments, the OLEDs G1, R1, B1 and G2 may be arranged in a pentile structure such that, in each pixel region PR1 and PR2, one OLED G1 and G2 of the first color (e.g., the green color) is disposed and one of the OLED R1 of the second color (e.g., the red color) or the OLED B1 of the third color (e.g., the blue color) is alternately disposed. Further, in one column (e.g., the even-numbered column) per two columns, the OLED R1 in the odd-numbered row may be driven by the sub-pixel circuit SPC4 in the even-numbered row, and the OLED G2 in the even-numbered row may be driven by the sub-pixel circuit SPC2 in the odd-numbered row. Accordingly, the OLED G1 and G2 of the first color (e.g., the green color) can be driven under a driving condition (e.g., a scan on time, an AOR, etc.) different from the driving condition for the OLEDs R1 and B1 of the second and third colors, and thus the mura and/or the afterimage may be reduced.

FIG. 2 is a circuit diagram illustrating the display panel of FIG. 1, and FIG. 3 is a diagram illustrating an exemplary layout of OLEDs included in the display panel of FIG. 1.

Referring to FIG. 2, a display panel 110 may include a plurality of sub-pixel regions SPR1, SPR2, SPR3, SPR4, SPR5, SPR6, SPR7 and SPR8, and, in each sub-pixel region SPR1, SPR2, SPR3, SPR4, SPR5, SPR6, SPR7 and SPR8, one of the OLEDs G1, R1, B1, G2, G3, B2, R2 and G4 and one sub-pixel circuit may be disposed. In some exemplary embodiments, green, red, green and blue OLEDs G1, R1, G3 and B2 may be sequentially and repeatedly arranged in an odd-numbered row, and blue, green, red and green OLEDs B1, G2, R2 and G4 may be sequentially and repeatedly arranged in an even-numbered row. However, the arrangements of the OLEDs are not limited to an example of FIG. 2.

In some exemplary embodiments, as illustrated in FIG. 2, each sub-pixel circuit may have a 7T1C structure including seven transistors T1, T2, T3, T4, T5, T6 and T7 and one capacitor CST. For example, each sub-pixel circuit may include a first transistor T1 which transfers a data signal to one terminal of a second transistor T2 in response to a scan signal SS1 and SS2, a storage capacitor CST which stores the data signal transferred through the diode-connected second transistor T2, the second transistor T2 which generates a driving current based on the data signal stored in the storage capacitor CST, a third transistor T3 which diode-connects the second transistor T2 in response to the scan signal SS1 and SS2, a fourth transistor T4 which applies an initialization voltage to the storage capacitor CST and a gate of the second transistor T2 in response to an initialization signal, a fifth transistor T5 which applies the initialization voltage to the OLED G1, R1, B1, G2, G3, B2, R2 and G4 in response to the scan signal SS1 and SS2, a sixth transistor T6 which connects a line of a high power supply voltage to the second transistor T2 in response to an emission control signal SE1 and SE2, and a seventh transistor T7 which connects the second transistor T2 to the OLED G1, R1, B1, G2, G3, B2, R2 and G4 in response to the emission control signal SE1 and SE2. However, the configuration of the sub-pixel circuit is not limited to the example of FIG. 2.

Each sub-pixel circuit in an odd-numbered column may drive the OLED G1, B1, G3 and R2 in a sub-pixel region SPR1, SPR3, SPR5 and SPR7 the same as a sub-pixel region SPR1, SPR3, SPR5 and SPR7 in which the sub-pixel circuit is disposed, and each sub-pixel circuit in an even-numbered column may drive the OLED G2, R1, G4 and B2 in a row different from a row in which the sub-pixel circuit is disposed. In the example of FIG. 2, a second OLED R1 in a second sub-pixel region SPR2 in a second column may be connected to a fourth sub-pixel circuit in a fourth sub-pixel region SPR4, a fourth OLED G2 in the fourth sub-pixel region SPR4 in the second column may be connected to a second sub-pixel circuit in the second sub-pixel region SPR2, a sixth OLED B2 in a sixth sub-pixel region SPR6 in a fourth column may be connected to an eighth sub-pixel circuit in an eighth sub-pixel region SPR8, and an eighth OLED G4 in the eighth sub-pixel region SPR8 in the fourth column may be connected to a sixth sub-pixel circuit in the sixth sub-pixel region SPR6.

In some exemplary embodiments, as illustrated in FIG. 3, each OLED G1, B1, G3 and R2 in the odd-numbered column may include an anode 111, 115, 121 and 125 formed to be connected to (a drain of the seventh transistor T7 of) a sub-pixel circuit in a sub-pixel region SPR1, SPR3, SPR5 and SPR7 the same as a sub-pixel region SPR1, SPR3, SPR5 and SPR7 in which the OLED G1, B1, G3 and R2 is disposed, and an organic light emitting layer 112, 116, 122 and 126 formed on the anode 111, 115, 121 and 125. However, each OLED G2, R1, G4 and B2 in the even-numbered column may include not only an anode 113, 117, 123 and 127 and an organic light emitting layer 114, 118, 124 and 128, but also an anode extension portion 113-1, 117-1, 123-1 and 127-1 formed to be connected to (a drain of the seventh transistor T7 of) a sub-pixel circuit in a row different from a row in which the OLED G2, R1, G4 and B2 is disposed. In some exemplary embodiments, the anode 113, 117, 123 and 127 and the anode extension portion 113-1, 117-1, 123-1 and 127-1 may be formed integrally or in a unitary structure by the same process. Thus, an additional process dedicated for the anode extension portion 113-1, 117-1, 123-1 and 127-1 may not be required.

Further, as illustrated in FIG. 2, sub-pixel circuits driving green OLEDs G1, G2, G3 and G4 may receive the same first scan signal SS1 and the same first emission control signal SE1, and sub-pixel circuits driving red and blue OLEDs B1, R1, R2 and B2 may receive a second scan signal SS2 different from the first scan signal SS1 and a second emission control signal SE2 different from the first emission control signal SE1. Since the sub-pixel circuits driving the green OLEDs G1, G2, G3 and G4 receive the first scan signal SS1 and the first emission control signal SE1 different from the second scan signal SS2 and the second emission control signal SE2 applied to the sub-pixel circuits driving the red and blue OLEDs B1, R1, R2 and B2, the green OLEDs G1, G2, G3 and G4 and the red and blue OLEDs B1, R1, R2 and B2 may be driven under different driving conditions (e.g., different SOTs, different off period ratios, etc.).

Figure 4:
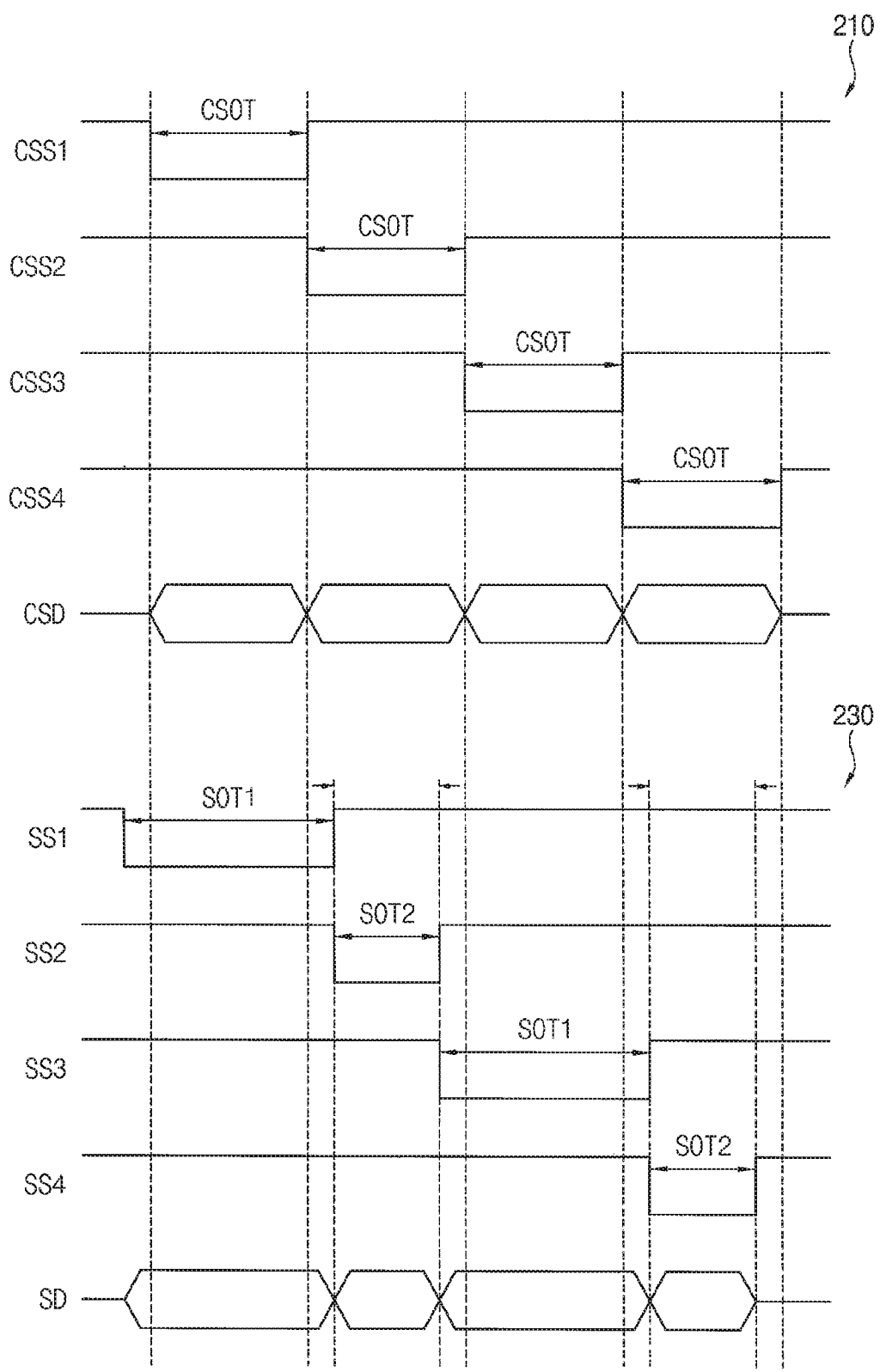
FIG. 4 is a timing diagram illustrating scan signals of a conventional OLED display device and scan signals of an OLED display device constructed according to the principles and exemplary embodiments of the invention.

FIG. 4 is a timing diagram illustrating scan signals of a conventional OLED display device and scan signals of an OLED display device according to the principles and exemplary embodiments of the invention.

In FIG. 4, 210 represents conventional scan signals CSS1, CSS2, CSS3 and CSS4 and a conventional data signal CSD, and 230 represents scan signals SS1, SS2, SS3 and SS4 and a data signal SD of an OLED display device according to exemplary embodiments of the invention.

The conventional scan signals CSS1, CSS2, CSS3 and CSS4 have the same scan on time CSOT. However, in the OLED display device according to exemplary embodiments, a second scan on time SOT2 of scan signals SS2 and SS4 applied to sub-pixel circuits in even-numbered rows for driving red and blue OLEDs may be decreased compared with the conventional scan on time CSOT, and a first scan on time SOT1 of scan signals SS1 and SS3 applied to sub-pixel circuits in odd-numbered rows for driving green OLEDs may be increased compared with the conventional scan on time CSOT. Further, referring to FIG. 2, during the scan on time SOT1 and SOT2, a first transistor T1 may be turned on to transfer the data signal SD, a third transistor T3 may be turned on to diode-connect a second transistor T2, and thus a threshold voltage compensation operation that a threshold voltage of the second transistor T2 is subtracted from the data signal SD in a storage capacitor CST may be performed. Accordingly, since the first scan on time SOT1 of the scan signals SS1 and SS3 applied to the sub-pixel circuits driving the green OLEDs is increased, a threshold voltage compensation time for the driving transistors T2 included in the sub-pixel circuits driving the green OLEDs may be increased, and thus a mura of the OLED display device may be reduced or prevented.

Figure 5:
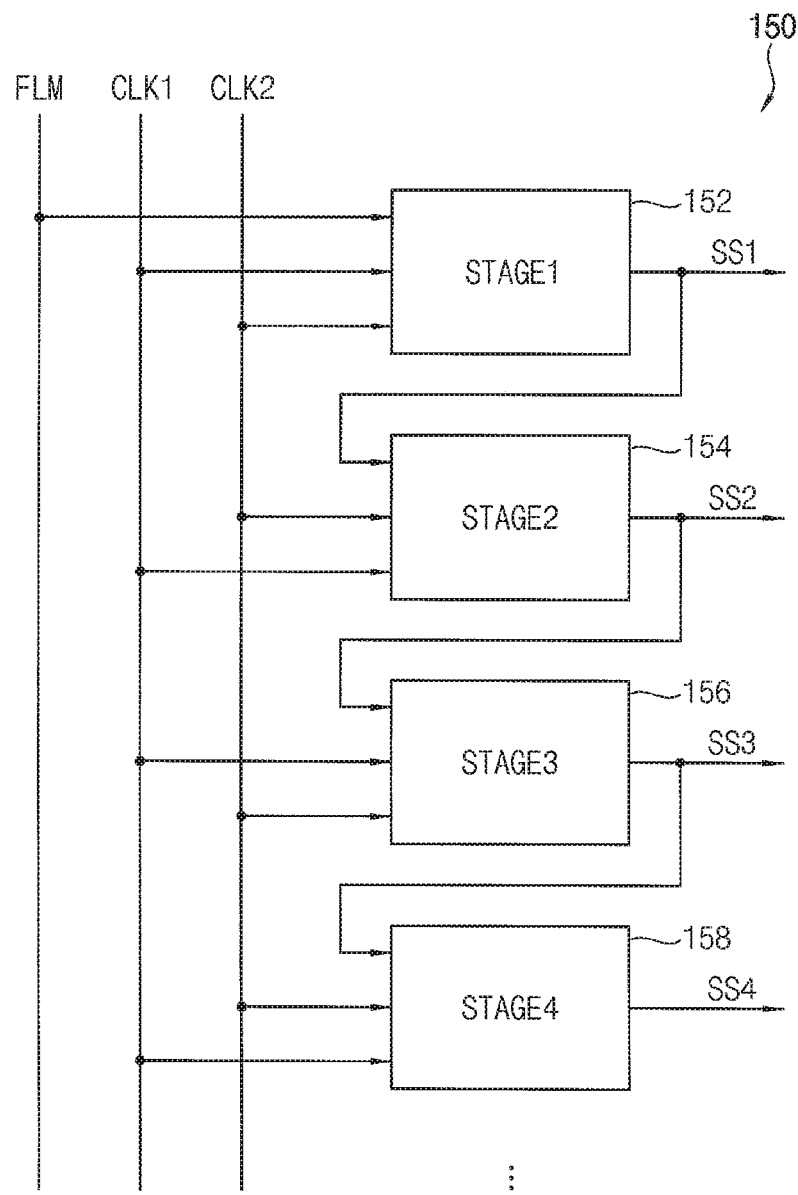
FIG. 5 is a block diagram illustrating a scan driver included in an OLED display device constructed according to an exemplary embodiment of the invention.
Figure 6:
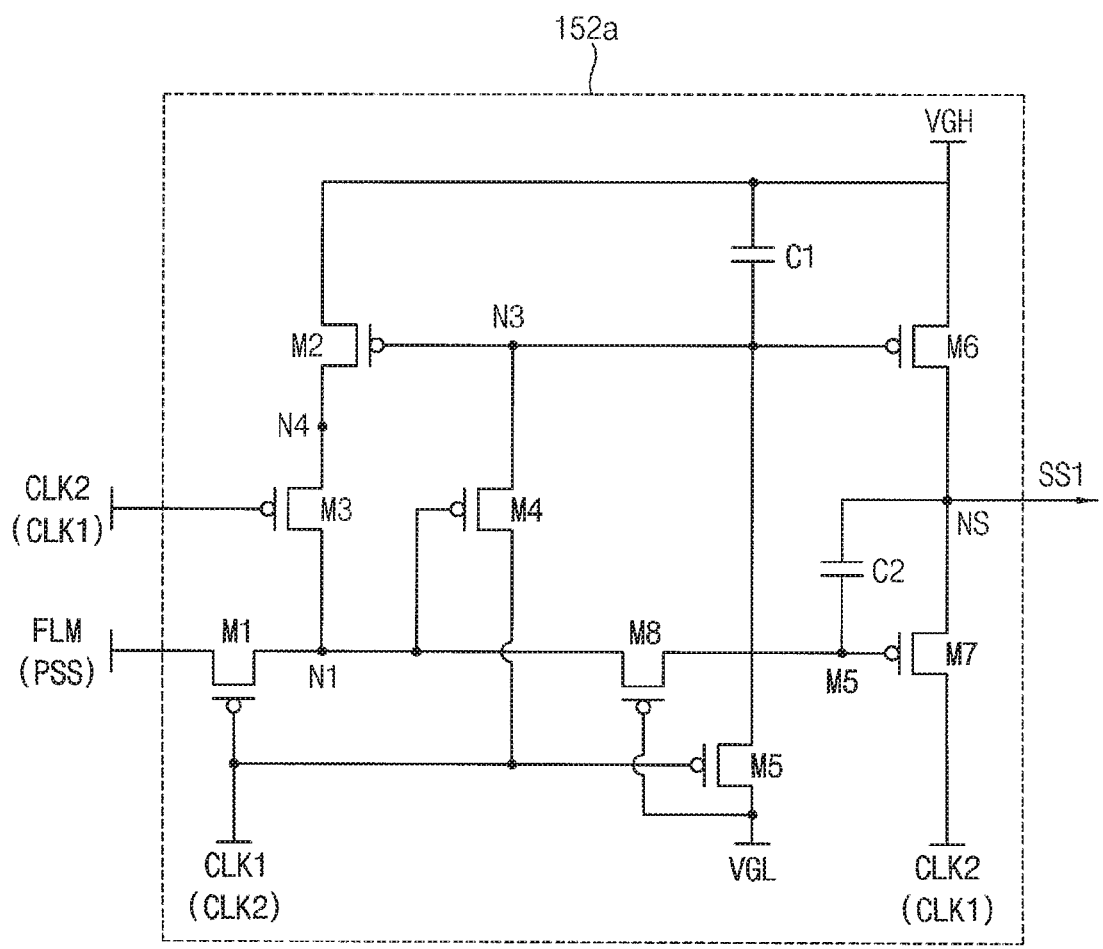
FIG. 6 is a circuit diagram illustrating an example of each stage included in the scan driver of FIG. 5.
Figure 7:
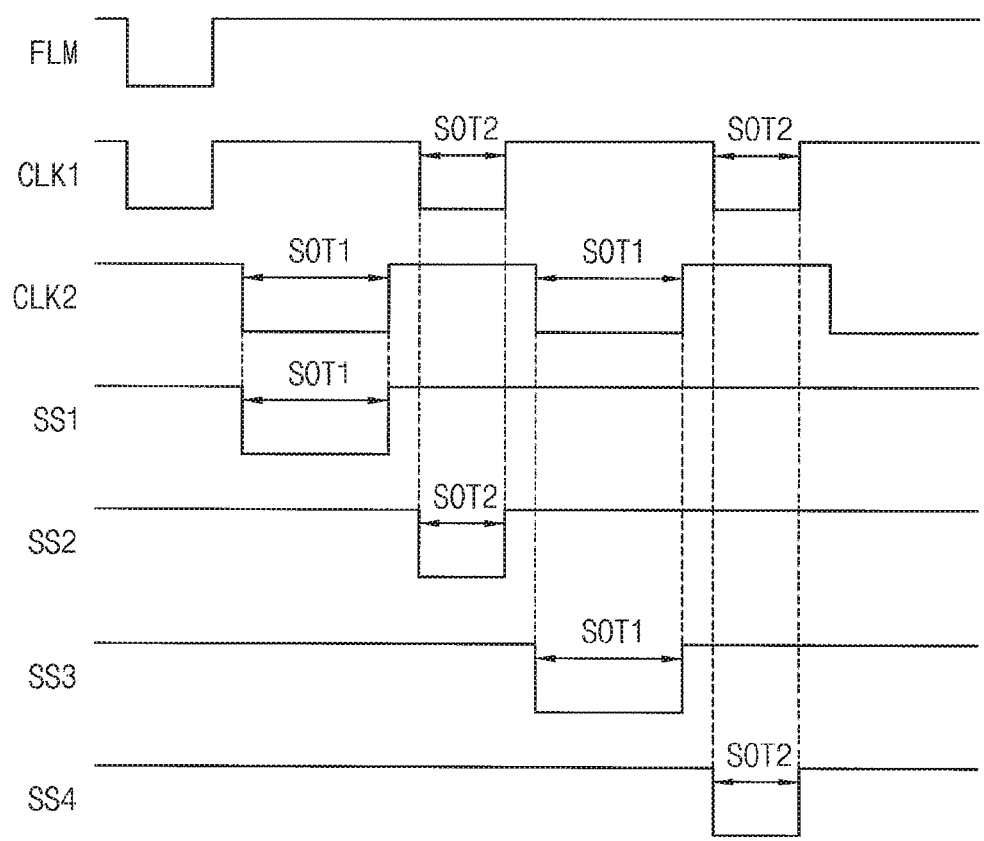
FIG. 7 is a timing diagram for describing an example of an operation of the scan driver of FIG. 5.

FIG. 5 is a block diagram illustrating a scan driver included in an OLED display device constructed according to an exemplary embodiment of the invention, FIG. 6 is a circuit diagram illustrating an example of each stage included in the scan driver of FIG. 5, and FIG. 7 is a timing diagram for describing an example of an operation of the scan driver of FIG. 5.

Referring to FIG. 5, a scan driver 150 included in an OLED display device according to exemplary embodiments may include a plurality of stages 152, 154, 156 and 158 which output a plurality of scan signals SS1, SS2, SS3 and SS4 in response to a start signal FLM (or a previous scan signal), a first clock signal CLK1 and a second clock signal CLK2.

In some exemplary embodiments, as illustrated in FIG. 6, each stage 152a may include a first transistor M1 which transfers the start signal FLM or the previous scan signal PSS to a first node N1 in response to the first clock signal CLK1 (or the second clock signal CLK2 in case of an even-numbered stage 154 and 158), a second transistor M2 which transfers a high gate voltage VGH to a fourth node N4 in response to a voltage of a third node N3, a third transistor M3 which transfers a voltage of the fourth node N4 to the first node N1 in response to the second clock signal CLK2 (or the first clock signal CLK1 in case of an even-numbered stage 154 and 158), a fourth transistor M4 which transfers the first clock signal CLK1 (or the second clock signal CLK2 in case of an even-numbered stage 154 and 158) to the third node N3 in response to a voltage of the first node N1, a fifth transistor M5 which transfers a low gate voltage VGL to the third node N3 in response to the first clock signal CLK1 (or the second clock signal CLK2 in case of an even-numbered stage 154 and 158), a sixth transistor M6 which outputs the high gate voltage VGH as the scan signal SS1 to a scan output node NS in response to the voltage of the third node N3, a seventh transistor M7 which outputs the second clock signal CLK2 (or the first clock signal CLK1 in case of an even-numbered stage 154 and 158) as the scan signal SS1 to the scan output node NS in response to a voltage of a second node N2, an eighth transistor M8 which transfers the voltage of the first node N1 to the second node N2 in response to the low gate voltage VGL, a first capacitor C1 connected between a line of the high gate voltage VGH and the third node N3, and a second capacitor C2 connected between the second node N2 and the scan output node NS. However, the configuration of each stage 152, 154, 156 and 158 of the scan driver 150 according to exemplary embodiments is not limited to the example of FIG. 6.

Referring to FIGS. 5 and 7, the second clock signal CLK2 may have an on period longer than an on period of the first clock signal CLK1. Thus, odd-numbered stages 152 and 156 may output the scan signals SS1 and SS3 having a relatively long scan on time SOT1 during the relatively long on period of the second clock signal CLK2, and even-numbered stages 154 and 158 may output the scan signals SS2 and SS4 having a relatively short scan on time SOT2 during the relatively short on period of the first clock signal CLK1. Accordingly, sub-pixel circuits in odd-numbered rows for driving green OLEDs may receive the scan signals SS1 and SS3 having the relatively long scan on time SOT1, a sufficient threshold voltage compensation time for driving transistors included in the sub-pixel circuits driving the green OLEDs may be obtained, and thus a mura of an OLED display device may be reduced or prevented.

Figure 8:
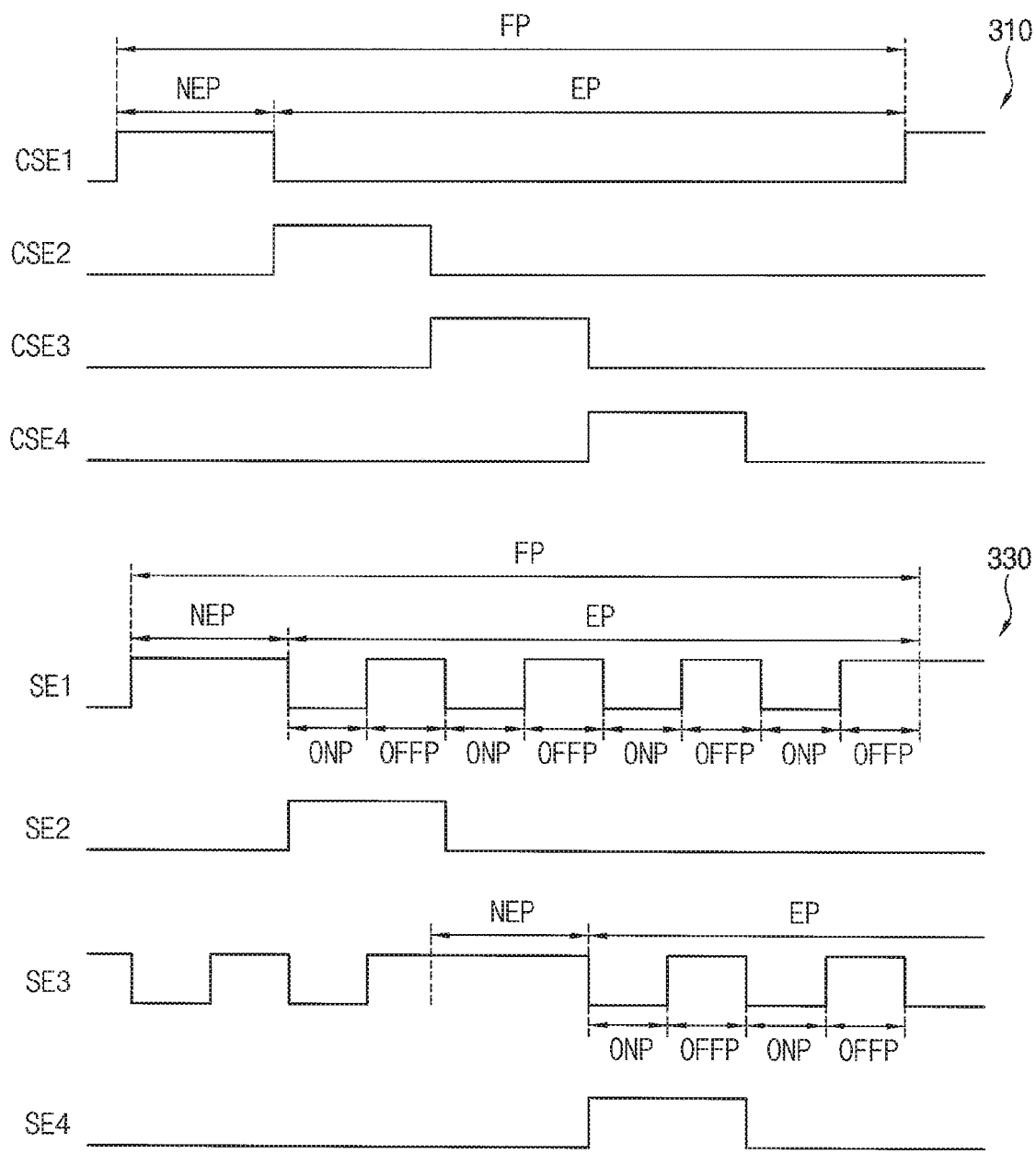
FIG. 8 is a timing diagram illustrating emission control signals of a conventional OLED display device and emission control signals of an OLED display device constructed according to the principles and exemplary embodiments of the invention.
Figure 9:
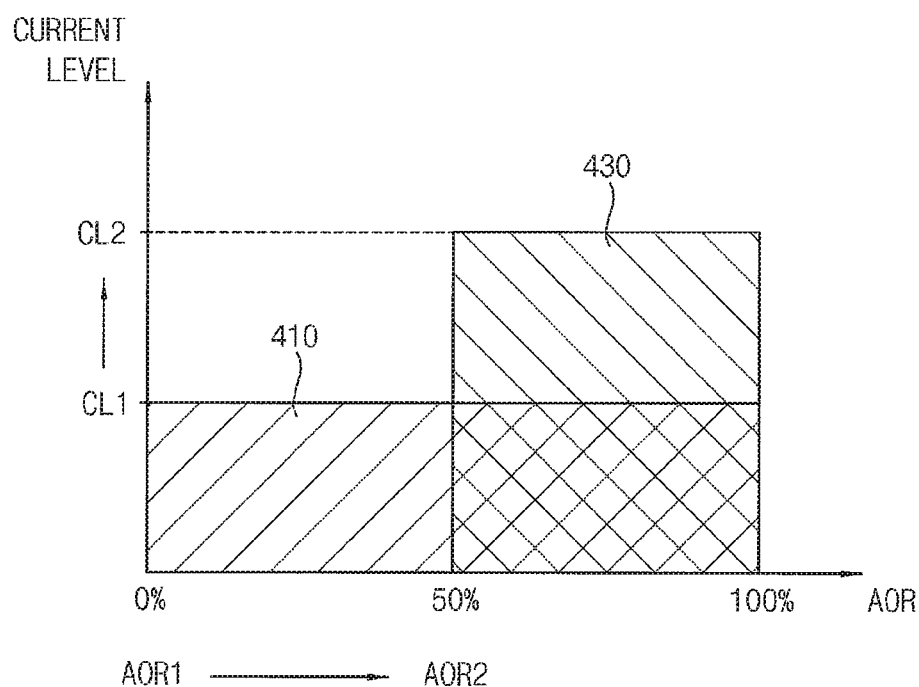
FIG. 9 is a graph illustrating the increase of a driving current level according to the increase of an AMOLED off ratio (AOR) in an OLED display device constructed according to the principles and an exemplary embodiment of the invention.

FIG. 8 is a timing diagram illustrating emission control signals of a conventional OLED display device and emission control signals of an OLED display device constructed according to the principles and exemplary embodiments of the invention, and FIG. 9 is a graph illustrating the increase of a driving current level according to the increase of an AMOLED off ratio (AOR) in an OLED display device constructed according to the principles and exemplary embodiments of the invention.

In FIG. 8, 310 represents conventional emission control signals CSE1, CSE2, CSE3 and CSE4, and 330 represents emission control signals SE1, SE2, SE3 and SE4 of an OLED display device according to exemplary embodiments. Each frame period FP may include a non-emission period NEP and an emission period EP. For example, the non-emission period NEP may be a period in which the emission control signals CSE1, CSE2, CSE3, CSE4, SE1, SE2, SE3 and SE4 have an off level (e.g., a high level), and may include a scan period and/or an initialization period. The emission period EP may be a period in which sixth and seventh transistors T6 and T7 are turned on to allow OLEDs to emit light in response to the emission control signals CSE1, CSE2, CSE3, CSE4, SE1, SE2, SE3 and SE4 having an on level (e.g., a low level).

During the emission period EP, the conventional emission control signals CSE1, CSE2, CSE3 and CSE4 may be maintained as the on level. However, in the OLED display device according to exemplary embodiments, at least a portion SE1 and SE3 of the emission control signals SE1, SE2, SE3 and SE4 may have on periods ONP and off periods OFFP within the emission period EP. In some exemplary embodiments, a first off period ratio (e.g., a ratio of a sum of lengths of the off periods OFFP to a length of the emission period EP) of the emission control signals SE1 and SE3 applied to sub-pixel circuits in odd-numbered rows for driving green OLEDs may be greater than a second off period ratio of the emission control signals SE2 and SE4 applied to sub-pixel circuits in even-numbered rows for driving red and blue OLEDs. For example, as illustrated in FIG. 8, the emission control signals SE2 and SE4 applied to the sub-pixel circuits in the even-numbered rows may be maintained as the on level, or may have an off period ratio of about 0%, and the emission control signals SE1 and SE3 applied to the sub-pixel circuits in the odd-numbered rows may have the off periods OFFP corresponding to a half of the emission period EP, or may have an off period ratio of about 50%. Thus, the sub-pixel circuits receiving the emission control signals SE2 and SE4 having the off period ratio of about 0% may drive the red and blue OLEDs with the off period ratio of about 0%, but the sub-pixel circuits receiving the emission control signals SE1 and SE3 having the off period ratio of about 50% may drive the green OLEDs with the off period ratio of about 50%. That is, the green OLEDs may be driven with an increased off period ratio.

Further, the sub-pixel circuits in the odd-numbered rows may provide the green OLEDs with a driving current that is increased corresponding to the increased off period ratio. For example, as illustrated in FIG. 9, if a second off period ratio AOR2 is increased to about 50% compared with a first off period ratio AOR1 of about 0%, the driving current provided to the green OLEDs may be increased from a first driving current level CL1 to a second driving current level CL2 such that an area 430 defined by the second off period ratio AOR2 and the second driving current level CL2 becomes substantially the same as an area 410 defined by the first off period ratio AOR1 and the first driving current level CL1. Accordingly, driving transistors included in the sub-pixels driving the green OLEDs may generate the increased driving current, or a higher driving current, thereby reducing an afterimage caused by a hysteresis of the driving transistors.

Figure 10:
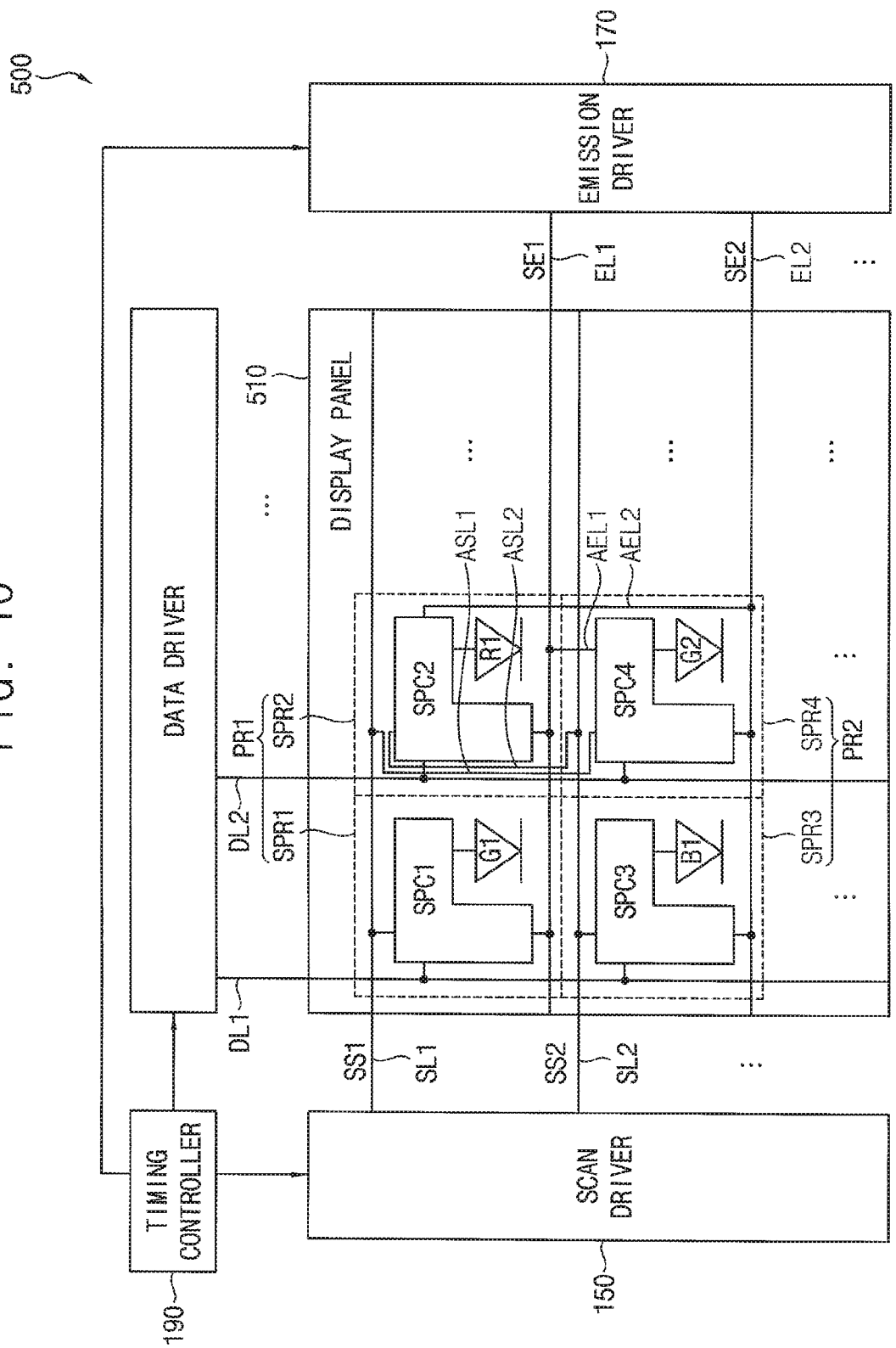
FIG. 10 is a block diagram illustrating an OLED display device constructed according to the principles and another exemplary embodiment of the invention.

FIG. 10 is a block diagram illustrating an OLED display device constructed according to the principles and another exemplary embodiment of the invention.

An OLED display device 500 of FIG. 10 may have a similar configuration and a similar operation to those of an OLED display device 100 of FIG. 1, except for the configuration of a display panel 510.

The display panel 510 may have a plurality of pixel regions PR1 and PR2, and each pixel region PR1 and PR2 may include two sub-pixel regions SPR1, SPR2, SPR3 and SPR4. Further, in each sub-pixel region SPR1, SPR2, SPR3 and SPR4, one OLED G1, R1, B1 and G2 and one sub-pixel circuit SPC1, SPC2, SPC3 and SPC4 may be disposed. In the display panel 510 of FIG. 10, unlike a display panel 110 of FIG. 1, each sub-pixel circuit SPC1, SPC2, SPC3 and SPC4 may drive the OLED G1, R1, B1 and G2 in a sub-pixel region SPR1, SPR2, SPR3 and SPR4 the same as a sub-pixel region SPR1, SPR2, SPR3 and SPR4 in which the sub-pixel circuit SPC1, SPC2, SPC3 and SPC4 is disposed.

However, a sub-pixel circuit (e.g., SPC2) in an even-numbered column may be connected to a scan line (e.g., SL2) and/or an emission control line (e.g., EL2) of a row different from a row in which the sub-pixel circuit (e.g., SPC2) is disposed. For example, a fourth sub-pixel circuit SPC4 in a fourth sub-pixel region SPR4 may be connected by a first auxiliary scan line ASL1 to a first scan line SL1 extending in a row direction through a first sub-pixel region SPR1 and a second sub-pixel region SPR2, and may be connected by a first auxiliary emission control line AEL1 to a first emission control line EL1 extending in the row direction through the first sub-pixel region SPR1 and the second sub-pixel region SPR2. Further, a second sub-pixel circuit SPC2 in the second sub-pixel region SPR2 may be connected by a second auxiliary scan line ASL2 to a second scan line SL2 extending in the row direction through a third sub-pixel region SPR3 and the fourth sub-pixel region SPR4, and may be connected by a second auxiliary emission control line ASL2 to a second emission control line EL2 extending in the row direction through the third sub-pixel region SPR3 and the fourth sub-pixel region SPR4. Accordingly, first and fourth sub-pixel circuits SPC1 and SPC4 driving green OLEDs G1 and G2 may be connected to the scan and emission control lines SL1 and EL1 separate from the scan and emission control lines SL2 and EL2 connected to second and third sub-pixels SPC2 and SPC3 driving red and blue OLEDs R1 and B1, and thus the green OLEDs G1 and G2 and the red and blue OLEDs R1 and B1 may be driven under different driving conditions (e.g., different SOTs, different off period ratios, etc.).

Figure 11:
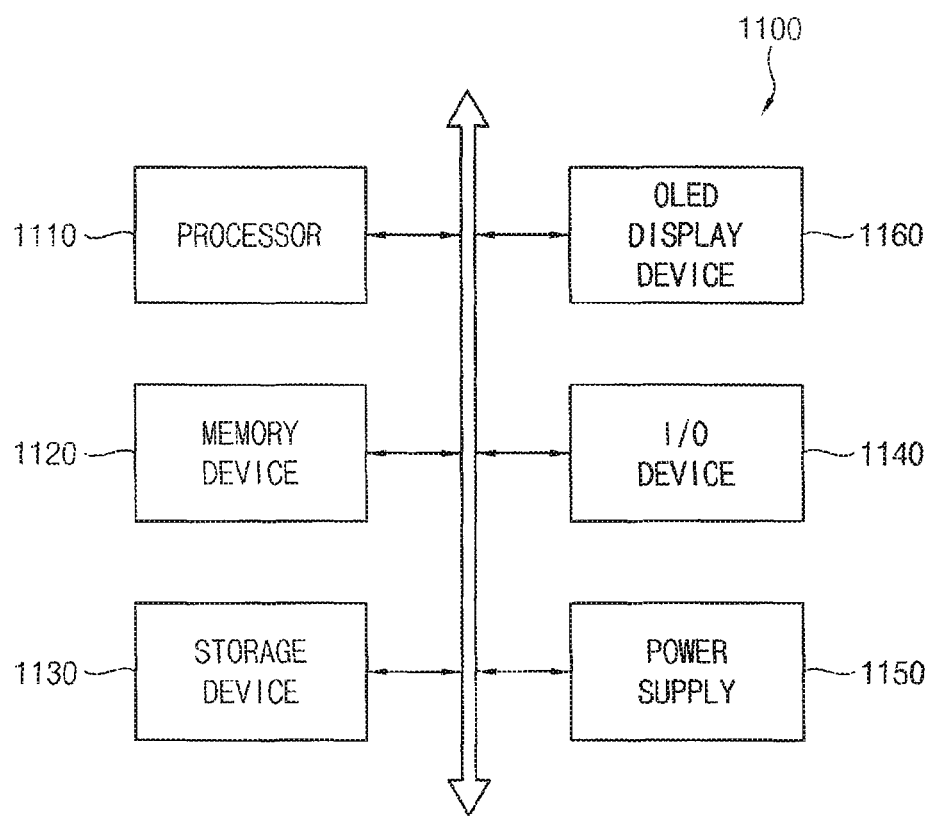
FIG. 11 is a block diagram illustrating an electronic device including an OLED display device constructed according to the principles and an exemplary embodiment of the invention.

FIG. 11 is a block diagram illustrating an electronic device including an OLED display device constructed according to the principles and an exemplary embodiment of the invention.

Referring to FIG. 11, an electronic device 1100 may include a processor 1110, a memory device 1120, a storage device 1130, an input/output (I/O) device 1140, a power supply 1150, and an OLED display device 1160. The electronic device 1100 may further include a plurality of ports for communicating a video card, a sound card, a memory card, a universal serial bus (USB) device, other electric devices, etc.

The processor 1110 may perform various computing functions or tasks. The processor 1110 may be an application processor (AP), a micro processor, a central processing unit (CPU), etc. The processor 1110 may be coupled to other components via an address bus, a control bus, a data bus, etc. Further, in some exemplary embodiments, the processor 1110 may be further coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc, and an output device such as a printer, a speaker, etc. The power supply 1150 may supply power for operations of the electronic device 1100.

In the OLED display device 1160, OLEDs may be arranged in a pentile structure such that, in each pixel region, an OLED of a first color (e.g., a green color) is disposed and one of an OLED of a second color (e.g., a red color) or an OLED of a third color (e.g., a blue color) alternately disposed. Further, in one column (e.g., an even-numbered column) per two columns, an OLED in an odd-numbered row may be driven by a sub-pixel circuit in an even-numbered row, and an OLED in the even-numbered row may be driven by a sub-pixel circuit in the odd-numbered row. Accordingly, the OLED of the first color (e.g., the green color) can be driven under a driving condition (e.g., a scan on time, an AOR, etc.) different from a driving condition for the OLEDs of the second and third colors, and thus a mura and/or an afterimage may be reduced.

According to exemplary embodiments, the electronic device 1100 may be any electronic device including the OLED display device 1160, such as a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel of an organic light emitting diode (OLED) display device, the display panel comprising:
    a first OLED disposed in a first sub-pixel region, and configured to emit light of a first color;
    a second OLED disposed in a second sub-pixel region adjacent to the first sub-pixel region in a row direction, and configured to emit light of a second color;
    a third OLED disposed in a third sub-pixel region adjacent to the first sub-pixel region in a column direction, and configured to emit light of a third color;
    a fourth OLED disposed in a fourth sub-pixel region adjacent to the second sub-pixel region in the column direction and adjacent to the third sub-pixel region in the row direction, and configured to emit light of the first color;
    a first sub-pixel circuit disposed in the first sub-pixel region, and configured to drive the first OLED in the first sub-pixel region;
    a second sub-pixel circuit disposed in the second sub-pixel region, and configured to drive the fourth OLED in the fourth sub-pixel region;
    a third sub-pixel circuit disposed in the third sub-pixel region, and configured to drive the third OLED in the third sub-pixel region; and
    a fourth sub-pixel circuit disposed in the fourth sub-pixel region, and configured to drive the second OLED in the second sub-pixel region.

2. The display panel of claim 1, wherein the first and second sub-pixel circuits receive a first emission control signal having substantially the same value through a first emission control line, and
    wherein the third and fourth sub-pixel circuits receive a second emission control signal having substantially the same value through a second emission control line.

3. The display panel of claim 2, wherein a first off period ratio of the first emission control signal applied to the first and second sub-pixel circuits is greater than a second off period ratio of the second emission control applied to the third and fourth sub-pixel circuits.

4. The display panel of claim 3, wherein the first and second sub-pixel circuits drive the first and fourth OLEDs to emit the light of the first color with the first off period ratio that is increased compared to the second off period ratio for the second and third OLEDs.

5. The display panel of claim 4, wherein the first and second sub-pixel circuits provide the first and fourth OLEDs with a driving current corresponding to the increased first off period ratio, the driving current being provided to the first and fourth OLEDs being greater than driving current provided to the second and third OLEDs.

6. The display panel of claim 2, wherein a first off period ratio of the first emission control signal applied to the first and second sub-pixel circuits is different from a second off period ratio of the second emission control applied to the third and fourth sub-pixel circuits.

7. The display panel of claim 1, wherein the first and second sub-pixel circuits each receives a first scan signal having substantially the same value through a first scan line, and
    wherein the third and fourth sub-pixel circuits each receives a second scan signal having substantially the same value through a second scan line.

8. The display panel of claim 7, wherein a first SOT of the first scan signal applied to the first and second sub-pixel circuits is longer than a second SOT of the second scan signal applied to the third and fourth sub-pixel circuits.

9. The display panel of claim 8, wherein the first and second sub-pixel circuits further comprise first driving transistors, the third and fourth sub-pixel circuits further comprise second driving transistors, a first threshold voltage compensation time for the first driving transistors is longer than a second threshold voltage compensation time for the second driving transistors.

10. The display panel of claim 7, wherein a first scan on time (SOT) of the first scan signal applied to the first and second sub-pixel circuits is different from a second SOT of the second scan signal applied to the third and fourth sub-pixel circuits.

11. The display panel of claim 1, wherein the first and fourth OLEDs are green OLEDs configured to emit green light, the second OLED is a red OLED configured to emit red light, and the third OLED is a blue OLED configured to emit blue light.

12. The display panel of claim 1, wherein the second OLED in the second sub-pixel region includes an anode extension portion connected to the fourth sub-pixel circuit, and
    wherein the fourth OLED in the fourth sub-pixel region includes another anode extension portion connected to the second sub-pixel circuit.

13. An organic light emitting diode (OLED) display device, comprising:
    a display panel;
    a data driver configured to provide data signals to the display panel;
    a scan driver configured to provide scan signals to the display panel;
    an emission driver configured to provide emission control signals to the display panel; and
    a timing controller configured to control the data driver, the scan driver and the emission driver,
    wherein the display panel comprises:
        a first OLED disposed in a first sub-pixel region, and configured to emit light of a first color;
        a second OLED disposed in a second sub-pixel region adjacent to the first sub-pixel region in a row direction, and configured to emit light of a second color;
        a third OLED disposed in a third sub-pixel region adjacent to the first sub-pixel region in a column direction, and configured to emit light of a third color;
        a fourth OLED disposed in a fourth sub-pixel region adjacent to the second sub-pixel region in the column direction and adjacent to the third sub-pixel region in the row direction, and configured to emit light of the first color;
        a first sub-pixel circuit disposed in the first sub-pixel region, and configured to drive the first OLED in the first sub-pixel region;

a second sub-pixel circuit disposed in the second sub-pixel region, and configured to drive the fourth OLED in the fourth sub-pixel region;
a third sub-pixel circuit disposed in the third sub-pixel region, and configured to drive the third OLED in the third sub-pixel region; and
a fourth sub-pixel circuit disposed in the fourth sub-pixel region, and configured to drive the second OLED in the second sub-pixel region.

* * * * *